(12) United States Patent
Choi (10) Patent No.: US 8,440,483 B2
(45) Date of Patent: May 14, 2013

(54) METHOD OF FABRICATING ARRAY SUBSTRATE

(75) Inventor: Hoo-Dong Choi, Gumi-si (KR)

(73) Assignee: LG Display Co., Ltd, Seoul (KR)

( * ) Notice: Subject to any disclaimer, the term of this patent is extended or adjusted under 35 U.S.C. 154(b) by 73 days.

(21) Appl. No.: 13/225,080

(22) Filed: Sep. 2, 2011

(65) Prior Publication Data

US 2012/0107983 A1    May 3, 2012

(30) Foreign Application Priority Data

Nov. 2, 2010  (KR) .......................... 10-2010-0108272

(51) Int. Cl.
*H01L 33/08* (2010.01)

(52) U.S. Cl.
USPC ..................................... 438/34; 257/E33.012

(58) Field of Classification Search ........................ None
See application file for complete search history.

(56) References Cited

U.S. PATENT DOCUMENTS

| 8,158,469 B2* | 4/2012 | Lee et al. ....................... 438/158 |
| 2008/0157081 A1* | 7/2008 | Huh ................................. 257/59 |
| 2011/0124162 A1* | 5/2011 | Lee et al. ...................... 438/158 |

* cited by examiner

*Primary Examiner* — Seahvosh Nikmanesh
(74) *Attorney, Agent, or Firm* — Brinks Hofer Gilson & Lione

(57) ABSTRACT

A method of fabricating an array substrate including forming a first metal layer; forming a gate insulating layer and an active layer; forming a second metal layer; forming a gate line, an etch-stopper and a gate electrode by patterning the first and second metal layers; forming an interlayer insulating layer including an opening, wherein the opening corresponds to the etch-stopper such that the opening is divided into first and second semiconductor contact holes respectively exposing both sides of the active layer; forming first and second ohmic contact layers, a source electrode, a drain electrode and a data line, the first and second ohmic contact layers respectively contacting both sides of the active layer through the first and second semiconductor contact holes; removing an exposed portion of the etch-stopper; and forming a pixel electrode contacting the drain electrode.

18 Claims, 9 Drawing Sheets

FIG. 2E
RELATED ART
dry-etching

FIG. 4B
crystallization

METHOD OF FABRICATING ARRAY SUBSTRATE

This application claims the benefit of Korea Patent Application No. 10-2010-0108272, filed on Nov. 2, 2010, the entire contents of which is incorporated herein by reference for all purposes as if fully set forth herein.

BACKGROUND

1. Field of the Invention

The present disclosure relates to an array substrate and more particularly to a method of fabricating an array substrate having an excellent mobility property and being capable of reducing a parasitic capacitance.

2. Discussion of the Related Art

As society has entered in earnest upon the information age, flat panel display devices, which have excellent characteristics such as a thin profile, light weight and low power consumption, and so on, have been introduced.

Among these devices, an active matrix type liquid crystal display (LCD) device is widely used for notebook computers, monitors, TV, and so on instead of a cathode ray tube (CRT), because of their high contrast ratio and characteristics adequate to display moving images.

On the other hand, an organic electroluminescent display (OELD) device is also widely used because its high brightness and low driving voltage. In addition, since the OELD device is a self-emission type, the OELD device produces high contrast ratio, has a thin profile and a fast response time.

Both the LCD device and the OELD device require an array substrate where a thin film transistor (TFT) is used as a switching element in each pixel for controlling the pixel to be turned on and off.

Figure 1:
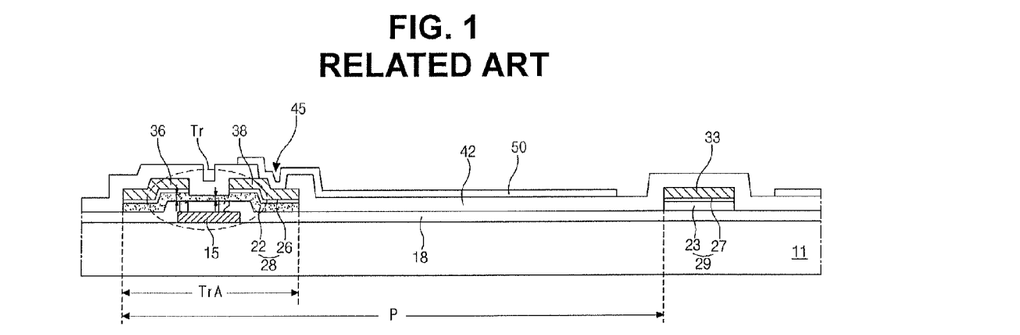
FIG. 1 is a cross-sectional view showing one pixel region of the related art array substrate.

FIG. 1 is a cross-sectional view showing one pixel region of the related art array substrate. In FIG. 1, a gate electrode 15 is formed on a substrate 11 and in a switching region "TrA", where a TFT "Tr" will be formed, inside a pixel region "P". A gate line (not shown) connected to the gate electrode 15 is formed along a first direction. A gate insulating layer 18 is formed on the gate electrode 15 and the gate line. A semiconductor layer 28 including an active layer 22 of intrinsic amorphous silicon and an ohmic contact layer 26 of impurity-doped amorphous silicon is formed on the gate insulating layer 18 and in the switching region "TrA". A source electrode 36 and a drain electrode 38 are formed on the semiconductor layer 28 and in the switching region "TrA". The source electrode 36 is spaced apart from the drain electrode 38. A data line 33 connected to the source electrode 36 is formed along a second direction. The data line 33 crosses the gate line to define the pixel region "P". The gate electrode 15, the gate insulating layer 18, the semiconductor layer 28, the source electrode 36 and the drain electrode 38 constitute the TFT "Tr".

A passivation layer 42 including a drain contact hole 45 is formed to cover the TFT "Tr". On the passivation layer 42, a pixel electrode 50 connected to the drain electrode 38 through the drain contact hole 45 is formed. In FIG. 1, first and second patterns 27 and 23, which are respectively formed of the same material as the ohmic contact layer 26 and the active layer 22, are formed under the data line 33.

In the semiconductor layer 28 of the TFT "Tr", the active layer 22 of intrinsic amorphous silicon has a difference in a thickness. Namely, the active layer 22 has a first thickness "t1" under the ohmic contact layer 26 and a second thickness "t2" at a center. The first thickness "t1" is different from the second thickness "t2". (t1≠t2) Properties of the TFT "Tr" are degraded by the thickness difference in the active layer 22. The thickness difference in the active layer 22 results from a fabricating process explained with reference to FIGS. 2A to 2E.

FIGS. 2A to 2E are cross-sectional views illustrating a fabricating process of the related art array substrate. For convenience of explanation, the gate electrode and the gate insulating layer under the active layer are not shown.

Figure 2A:
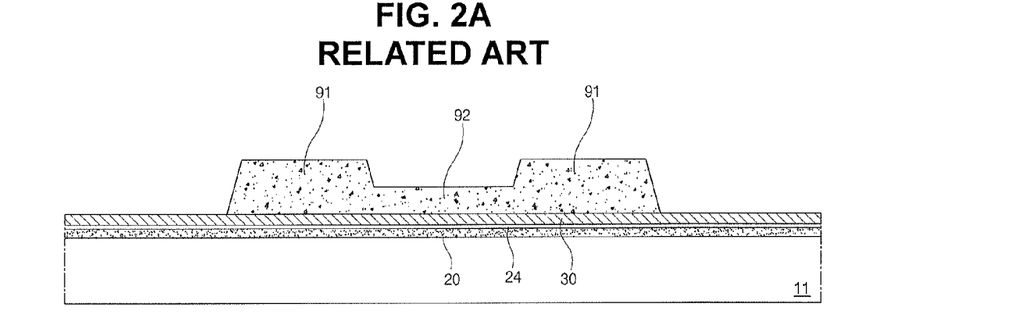
FIGS. 2A to 2E are cross-sectional views illustrating a fabricating process of the related art array substrate.

In FIG. 2A, an intrinsic amorphous silicon layer 20, an impurity-doped amorphous silicon layer 24 and a metal layer 30 are sequentially formed on the substrate 11. Then, a photoresist (PR) layer (not shown) is formed on the metal layer 30 by coating a PR material. The PR layer is exposed using an exposing mask and developed to form a first PR pattern 91 having a third thickness and a second PR pattern 92 having a fourth thickness smaller than the third thickness. The first PR pattern 91 covers a portion of the metal layer 30 where the source and drain electrodes are formed, and the second PR pattern 92 covers a space between the source and drain electrodes. The first PR pattern 91 is positioned at both sides of the second PR pattern 92. Other portions of the metal layer 30 are exposed.

Figure 2B:
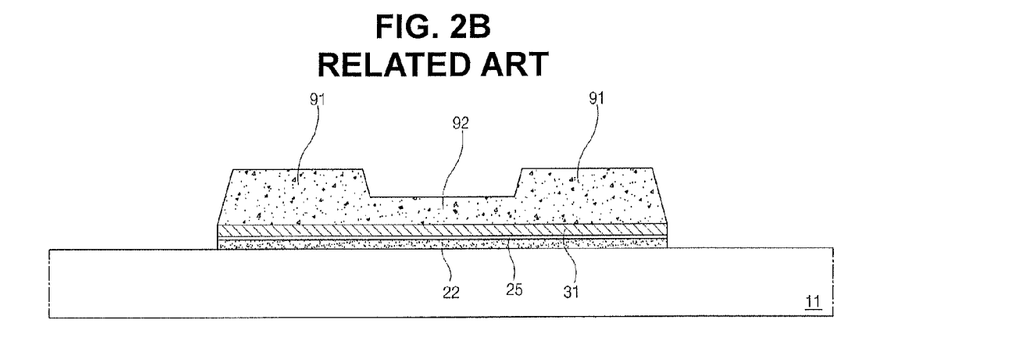

In FIG. 2B, the exposed metal layer 30 (of FIG. 2A) and the impurity-doped amorphous silicon layer 24 (of FIG. 2A) and the intrinsic amorphous silicon layer 20 (of FIG. 2A) under the exposed metal layer 30 are etched using the first and second PR patterns 91 and 92 as an etching mask. As a result, the active layer 22, an impurity-doped amorphous silicon pattern 25 and a source-drain pattern 31 are formed on the substrate 11.

Figure 2C:
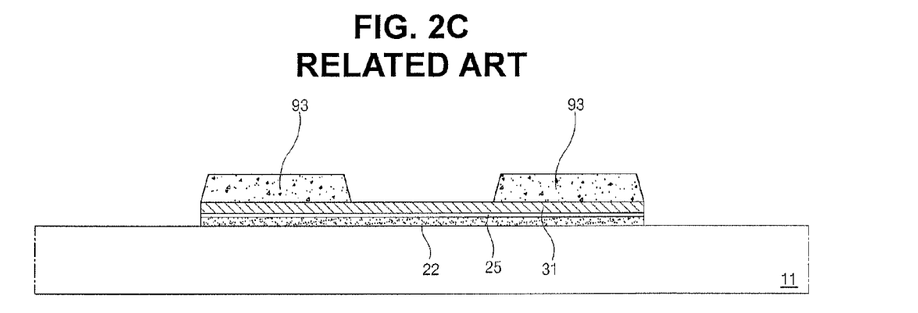

In FIG. 2C, an ashing process is performed onto the first and second PR patterns 91 and 92 (of FIG. 2B) such that the second PR pattern 92 having the fourth thickness is removed. The first PR pattern 91 is partially removed such that a third PR pattern 93, which has a smaller thickness than the first PR pattern 91, is formed on the source-drain pattern 31. A central portion of the source-drain pattern 31 is exposed by removing the second PR pattern 92.

Figure 2D:
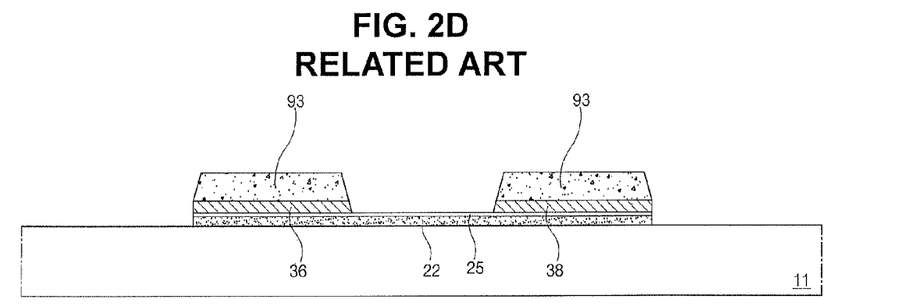

In FIG. 2D, the exposed central portion of the source-drain pattern 31 (of FIG. 2C) is etched to form the source and drain electrodes 36 and 38 spaced apart from each other. As a result, a central portion of the impurity-doped amorphous silicon pattern 25 is exposed through the source and drain electrodes 36 and 38.

Figure 2E:
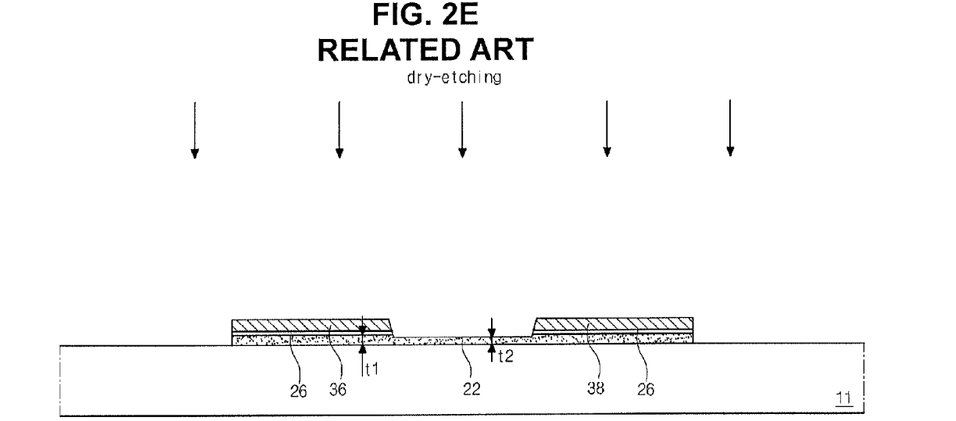

In FIG. 2E, a dry-etching process is performed onto the impurity-doped amorphous silicon pattern 25 (of FIG. 2D) to removed the impurity-doped amorphous silicon pattern 25. As a result, the ohmic contact layer 26 is formed under the source and drain electrodes 36 and 38.

In this case, the dry-etching process is performed for a relative long time to completely remove the impurity-doped amorphous silicon pattern 25 exposed through a space between the source and drain electrodes 36 and 38. As a result, a central portion of the active layer 22 under the removed impurity-doped amorphous silicon pattern 25 is partially removed by the dry-etching process such that the active layer 22 has a difference in a thickness. (t1≠t2) If the dry-etching process is not performed for an enough long time, the impurity-doped amorphous silicon pattern 25 partially remains on the active layer 22 such that properties of the TFT "Tr" (of FIG. 1) are seriously degraded. The thickness difference in the active layer 22 is an inevitable result of the above fabricating process for the array substrate.

In addition, since the active layer 22 is partially removed during the dry-etching process, the intrinsic amorphous silicon layer 20 for the active layer 22 should be formed to have an enough thickness above 1000 angstroms such that there are disadvantages in production costs and a fabricating time.

The TFT is very important element for the array substrate. The TFT is positioned in each pixel region and connected to the gate and data line such that a signal is selectively provided the pixel electrode in each pixel region through the TFT. Unfortunately, since the active layer of the TFT is formed of intrinsic amorphous silicon, there are some problems. For example, when light is irradiated onto the active layer or an electric field is applied to the active layer, the active layer is changed to be a metastable state such that there is a problem of a security of the TFT. In addition, since the active layer of intrinsic amorphous silicon has a relatively low carrier mobility, e.g., 0.1 cm$^2$/V·s~1.0 cm$^2$/V·s, in a channel, the TFT including the active layer of intrinsic amorphous silicon is not adequate to a driving element for the OELD device.

To resolve these problems, the TFT including an active layer of polycrystalline silicon, which is crystallized from intrinsic amorphous silicon by a crystallization process using a laser beam, is introduced. However, referring to FIG. 3, which is a cross-sectional view showing a TFT "Tr" including a semiconductor layer 55 of polycrystalline silicon for the related art array substrate, the semiconductor layer 55 includes a first region 55a and a second region 55b at both sides of the first region 55a. High concentration impurities should be doped into the second region 55b of the semiconductor layer 55. Accordingly, a doping process for the second region 55b and an implant apparatus for the doping process are required such that production costs are seriously increased. In addition, new process line is required.

BRIEF SUMMARY

A method of fabricating an array substrate includes forming a first metal layer on a substrate including a transistor region in a pixel region; forming a gate insulating layer on the first metal layer and an active layer of polycrystalline silicon on the gate insulating layer, the gate insulating layer and the active layer disposed in the transistor region, forming a second metal layer on an entire surface of the substrate including the active layer; forming a gate line, an etch-stopper and a gate electrode by patterning the second metal layer and the first metal layer, the gate electrode disposed in the transistor region and under the gate insulating layer, the etch-stopper disposed on the active layer, and the gate line contacting an end of the gate electrode; forming an interlayer insulating layer disposed on the gate line and including an opening, wherein the opening corresponds to the etch-stopper such that the opening is divided into first and second semiconductor contact holes respectively exposing both sides of the active layer; forming first and second ohmic contact layers of impurity-doped amorphous silicon, a source electrode, a drain electrode and a data line on the interlayer insulating layer, the first and second ohmic contact layers respectively contacting both sides of the active layer through the first and second semiconductor contact holes, the source electrode and the drain electrode respectively disposed on the first and second ohmic contact layers, and the data line crossing the gate line to define the pixel region and being connected to the source electrode; removing a portion of the etch-stopper exposed through a space between the source electrode and the drain electrode; and forming a pixel electrode in the pixel region and contacting the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE DRAWINGS AND THE PRESENTLY PREFERRED EMBODIMENTS

Reference will now be made in detail to the embodiments, examples of which are illustrated in the accompanying drawings.

FIGS. 4A to 4L are cross-sectional views showing a fabricating process of an array substrate for an LCD device according to an embodiment of the present invention. For convenience of explanation, a transistor region "TrA", where a TFT is formed, a gate pad region "GPA", where a gate pad electrode is formed, and a data pad region "DPA", where a data pad electrode is formed, are defined.

Figure 4A:
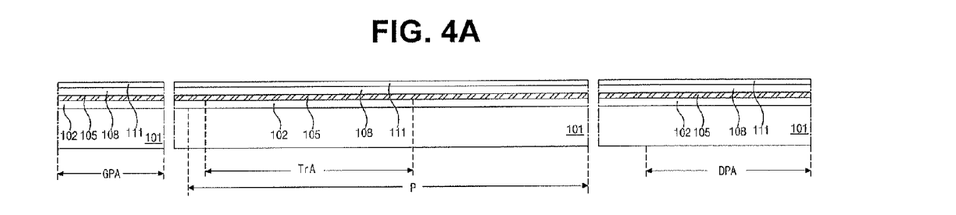
FIGS. 4A to 4L are cross-sectional views showing a fabricating process of an array substrate for an LCD device according to an embodiment of the present invention.

As shown in FIG. 4A, a buffer layer 102 is formed on a substrate 101 by depositing an inorganic insulating material or an organic insulating material. For example, the inorganic insulating material may include silicon oxide or silicon nitride, and the organic insulating material may include benzocyclobutene (BCB) or photo-acryl. For example, the substrate 101 may be a transparent glass substrate. The buffer layer 102 has a thickness of about 1000 to 3000 angstroms.

A crystallization process is required in the present invention for crystallizing an amorphous silicon into a polycrystalline silicon layer. The crystallization process is performed under a temperature of about 600 to 800° C. When the substrate 101 is exposed to the process temperature of the SPC process without the buffer layer 102, an alkali ion is diffused from the substrate 101 to the polycrystalline silicon layer such that properties of the polycrystalline silicon layer is degraded. To prevent this problem, the buffer layer 102 is required. However, the buffer layer 102 may be omitted.

Next, a gate metal layer 105 is formed on the buffer layer 102 by depositing a metallic material having a high melting point above about 800° C. For example, the metallic material may include molybdenum (Mo), molybdenum-titanium alloy (MoTi), copper (Cu) or Cu alloy.

The above metallic material has a relatively high resistance. However, the metallic material has the melting point higher than the crystallization process temperature and low deformation property under the melting point. In addition, there is no possibility of generating pores therein, and a degree of expansion and contraction depending on a rapid temperature change.

Next, a first insulating layer 108 and an intrinsic amorphous silicon layer 111 are sequentially formed on the gate metal layer 105 by coating or depositing an insulating material and intrinsic amorphous silicon. The first insulating layer 108 may be formed of an inorganic insulating material, for example, silicon oxide or silicon nitride, and have a thickness of about 500 to 4000 angstroms.

The intrinsic amorphous silicon layer 111 has a thickness of about 300 to 1000 angstroms. In the related art array substrate, the active layer of intrinsic amorphous silicon should have a thickness above 1000 angstroms because the active layer is partially removed by the dry-etching process for the ohmic contact layer. However, since an active layer 115 (of FIG. 4L) is not exposed to a dry-etching process due to an etch-stopper 120 (of FIG. 4G), the intrinsic amorphous silicon layer 111 has a thickness being capable of serving as an active layer. Namely, the intrinsic amorphous silicon layer 111 has a relatively low thickness of about 300 to 1000 angstroms such that production costs and a fabricating time are reduced.

Figure 4B:
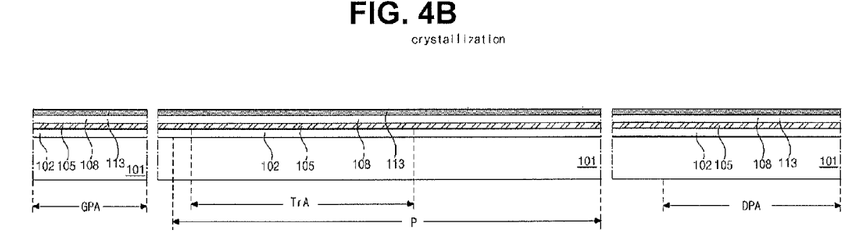

Next, as shown in FIG. 4B, to improve a mobility property of the intrinsic amorphous silicon layer 111 (of FIG. 4A), the crystallization process is performed. The intrinsic amorphous silicon layer 111 is crystallized by the crystallization process to form an intrinsic polycrystalline silicon layer 113.

For example, the crystallization process may be a solid phase crystallization (SPC) process or a laser crystallization process. The SPC process may be a thermal crystallization process or an alternating magnetic field crystallization process. In the thermal crystallization process, the intrinsic amorphous silicon layer 111 is heated under a temperature of about 600 to 800° C. In the alternating magnetic field crystallization process, the intrinsic amorphous silicon layer 111 is crystallized using an alternating magnetic field crystallization apparatus under a temperature of about 600 to 700° C. The laser crystallization process may be an excimer laser annealing.

Figure 4C:
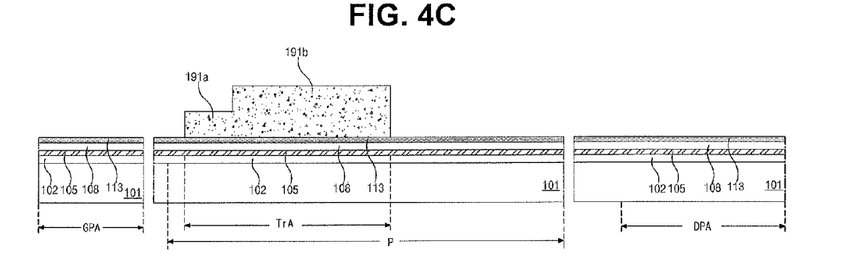

Next, as shown in FIG. 4C, a photoresist (PR) layer (not shown) is formed on the intrinsic polycrystalline silicon layer 113 by coating a PR material. An exposing mask (not shown) including a transmissive portion, a blocking portion and a half-transmissive portion is disposed over the PR layer. The half-transmissive portion has light transmittance smaller than the transmissive portion and larger than the blocking portion. The half-transmissive portion is formed of a slit or multiple coating layers. The exposing mask may be referred to as a half-tone mask. The PR layer is exposed through the exposing mask and developed to form a first PR pattern 191a having a first thickness and a second PR pattern 191b having a second thickness larger than the first thickness. The first and second PR patterns 191a and 191b are positioned in the transistor region "TrA". The second PR pattern 191b corresponds to a region where an active layer 115 (of FIG. 4L) will be formed, and the first PR pattern 191a corresponds to the other region of the transistor region "TrA". The intrinsic polycrystalline silicon layer 113 in other regions, e.g., the gate pad region "GPA", the data pad region "DPA", and a pixel region "P" except the transistor region "TrA" are exposed.

Figure 4D:
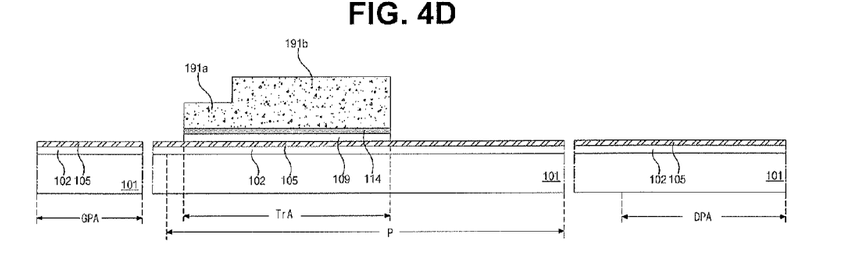

Next, as shown in FIG. 4D, the exposed intrinsic polycrystalline silicon layer 113 (of FIG. 4C) and the first insulating layer 108 (of FIG. 4C) under the exposed intrinsic polycrystalline silicon layer 113 are sequentially etched to form a gate insulating layer 109 and an intrinsic polycrystalline silicon pattern 114 stacked on the gate metal layer 105. The gate insulating layer 109 and the intrinsic polycrystalline silicon pattern 114 have an island shape in the transistor region "TrA".

The intrinsic polycrystalline silicon layer 113 is patterned by a dry-etching process, while the first insulating layer 108 of silicon oxide is patterned by a wet-etching process using a buffered oxide etchant (BOE). When the first insulating layer 108 is formed of silicon nitride, the first insulating layer 108 is patterned by a dry-etching process using a reaction gas or a wet-etching process using a developing solution.

Figure 4E:
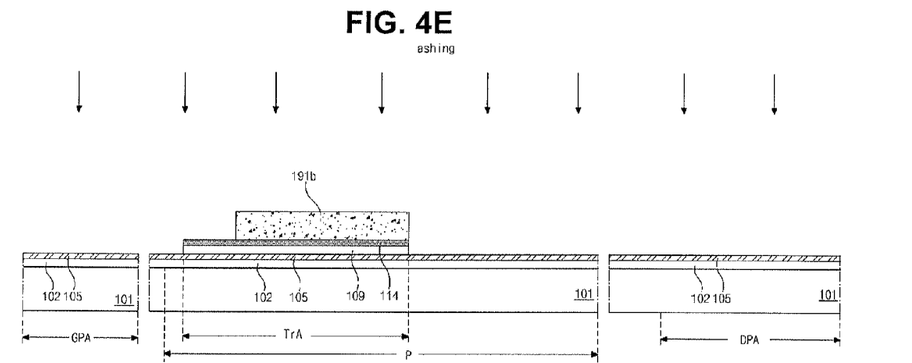

Next, as shown in FIG. 4E, an ashing process is performed on to the first and second PR patterns 191a and 191b (of FIG. 4D) to remove the first second PR pattern 191a and expose an end of the intrinsic polycrystalline silicon pattern 114 at one side of the transistor region "TrA". Although a thickness of the second PR pattern 191b is reduced by the ashing process, the second PR pattern 191b still remains on the intrinsic polycrystalline silicon pattern 114.

Figure 4F:
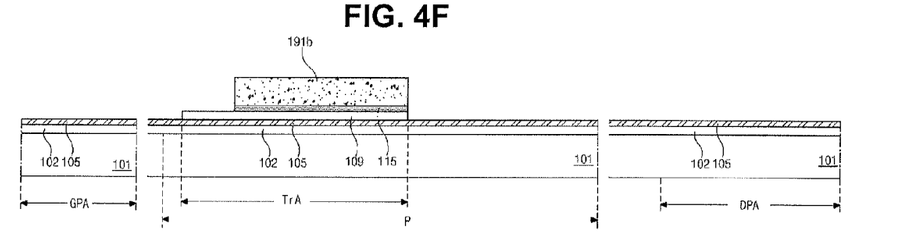

Next, as shown in FIG. 4F, the exposed intrinsic polycrystalline silicon pattern 114 (of FIG. 4E) is etched to expose edges of the gate insulating layer 109 and form an active layer 115 from the intrinsic polycrystalline silicon pattern 114 under the second PR pattern 191b.

Figure 4G:
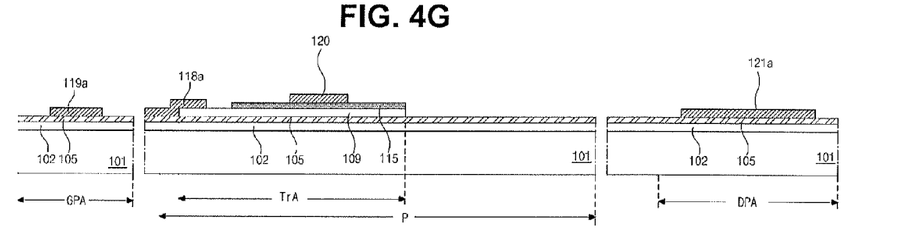

Next, as shown in FIG. 4G, a stripping process is performed onto the second PR pattern 191b (of FIG. 4F) to remove the second PR pattern 191b and expose the active layer 115.

Next, a first metal layer (not shown) is formed on the active layer 115. The first metal layer may be formed of a low resistance metallic material. For example, the first metal layer is formed by depositing at least one of aluminum (Al), Al alloy (AlNd), Cu, Cu alloy, Mo and chromium (Cr). The first metal layer is patterned by a mask process, which includes a step of forming a PR layer, a step of exposing the PR layer using an exposing mask, a step of developing the PR layer to form a PR pattern, a step of etching the first metal layer using the PR pattern as an etching mask, and a step of stripping the PR pattern, to form a first gate pattern 118a along one direction. The first gate pattern 118a covers a side of the gate insulating layer 109 such that the first gate pattern 118a contacts the gate metal layer 105. An end of the first gate pattern 118a is disposed on the exposed portion of the gate insulating layer 109.

At the same time, an etch-stopper 120 is formed from the first metal layer. The etch-stopper 120 corresponds to a center of the active layer 115 and has an island shape. The etch-stopper 120 serves as a protector of the active layer 115 against a dry-etching process. In addition, as described below, an aperture ratio is improved and a parasitic capacitance is reduced due to the etch-stopper 120.

Simultaneously, a first gate pad pattern 119a is formed on the gate metal layer 105 and in the gate pad region "GPA", and a first data pad pattern 121a is formed on the gate metal layer 105 and in the data pad region "DPA". The first gate pad pattern 119a is connected to an end of the first gate pattern 118a.

The first metal layer (not shown) has a single-layered structure. Alternatively, the first metal layer may have a double-layered structure or a triple-layered structure by depositing two or three of the above metallic material. For example, the first metal layer may have a double-layered structure including Al alloy and Mo or a triple-layered structure including Mo, Al alloy and Mo.

Figure 4H:
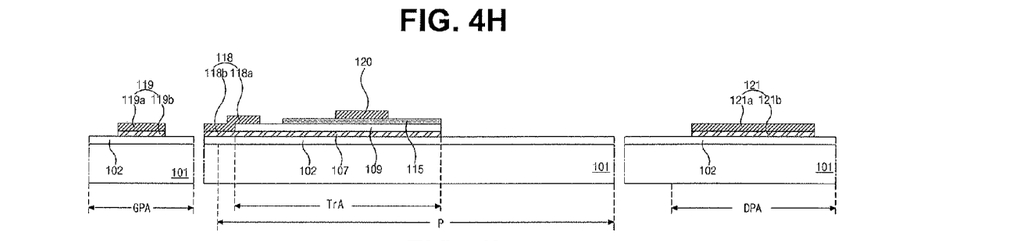

Next, as shown in FIG. 4H, the exposed gate metal layer 105 (of FIG. 4G) by the first gate pattern 118a, the first gate pad pattern 119a, the first data pad pattern 121a and the active layer 115 is removed. As a result, a gate electrode 107 from the gate metal layer 105 is formed in the transistor region "TrA" and under the gate insulating layer 109. One end of the gate electrode 107 contacting the first gate pattern 118a is defined as a second gate pattern 118b such that the first gate pattern 118a and the second gate pattern 118b constitute a gate line 118. In addition, a portion of the gate metal layer 105 under the first gate pad pattern 119a remains and is defined as a second gate pad pattern 119b. The first and second gate pad patterns 119a and 119b constitute a gate pad electrode 119. Similarly, a portion of the gate metal layer 105 under the first data pad pattern 121a remains and is defined as a second data pad pattern 121b. The first and second data pad patterns 121a and 121b constitute a data pad electrode 121. Namely, each of the gate line 118, the gate pad electrode 119 and the data pad electrode 121 has at least double layers. In addition, the data pad electrode 121 are formed of the same material and at the same layer as the gate pad electrode 119.

Figure 4I:
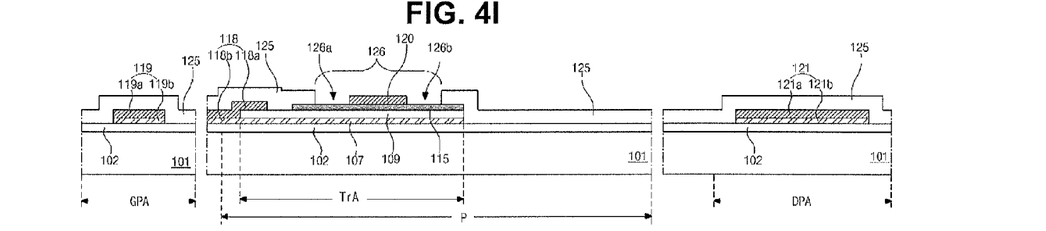

Next, as shown in FIG. 4I, a second insulating layer (not shown) is formed on the active layer 115, the etch-stopper 120, the gate line 118, the gate pad electrode 119 and the data pad electrode 121 by depositing an inorganic insulating material, such as silicon oxide and silicon nitride, or coating an organic insulating material, such as BCB and photo-acryl.

The second insulating layer is patterned by a mask process to form an interlayer insulating layer 125 including an opening 126. The opening 126 corresponds to a center of the active layer 115. The opening 126 overlaps the etch-stopper 120 and has a size larger than the etch-stopper 120 such that the opening 126 is divided into first and second semiconductor contact holes 126a and 126b with respect to the etch-stopper 120. One and the other sides of the active layer 115 are respectively exposed through the first and second semiconductor contact holes 126a and 126b.

Figure 3:
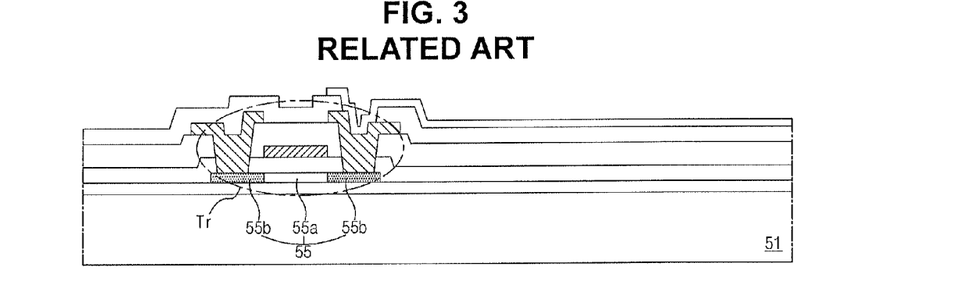
FIG. 3 is a cross-sectional view showing a TFT including a semiconductor layer of polycrystalline silicon for the related art array substrate.

In the related art, as shown in FIG. 3, two contact holes are required. However, in the present invention, one opening 126 is required to form the first and second semiconductor contact holes 126a and 126b due to the etch-stopper 120. Accordingly, an area required for the contact holes is reduced in the present invention such that an aperture ratio is improved.

The contact hole is formed by patterning an insulating layer using PR patterns. Unfortunately, because of a margin of forming the PR patterns and an etching rate of the insulating layer, a minimum size of the contact hole is above 5 micrometers.

Figure 5:
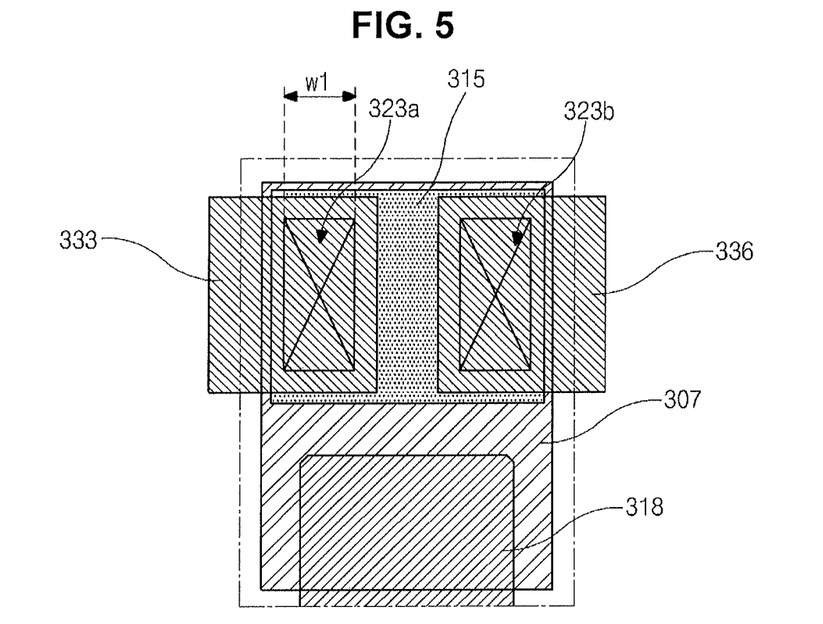
FIG. 5 is a plan-view showing a TFT of the related art an array substrate.

Accordingly, referring to FIG. 5, which is a plan-view showing a TFT of the related art an array substrate, each of the first and second semiconductor contact holes 323a and 323b, which respectively exposes one and the other sides of the active layer 315, has a width "w1" above 5 micrometers.

Figure 6:
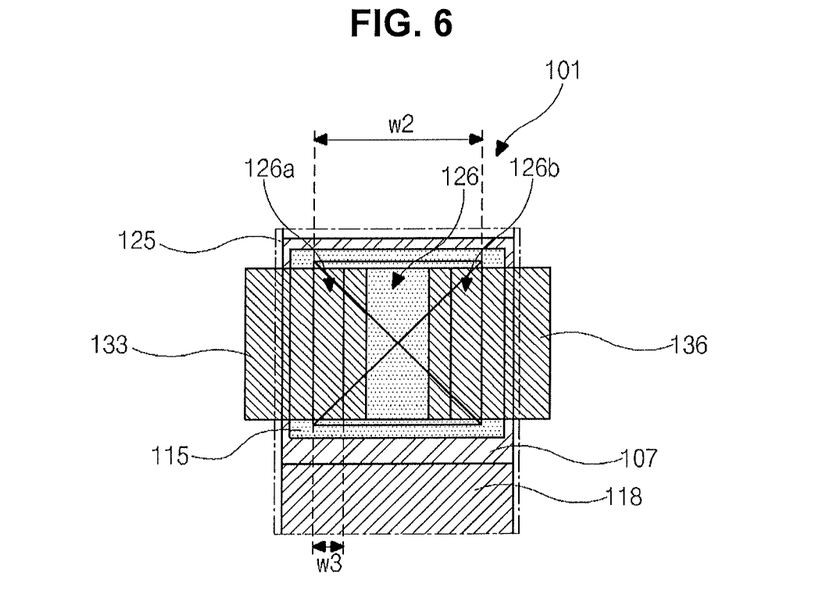
FIG. 6 is a plan-view of a TFT of an array substrate according to the present invention.

However, referring to FIG. 6, which is a plan-view of a TFT of an array substrate according to the present invention, the opening 126, which is divided into the first and second semiconductor contact holes 126a and 126b, has a width "w2" above 5 micrometers. Accordingly, when the etch-stopper 120 has a width of 10 micrometers and the opening 126 has the width "w2" of 14 micrometers, each of the first and second semiconductor contact holes 126a and 126b has a width "w3" of 2 micrometers smaller than 5 micrometers. Namely, a size of the first and second semiconductor contact holes 126a and 126b is smaller than that of the first and second semiconductor contact holes 323a and 323b.

As mentioned above, since the size of the first and second contact holes 126a and 126b is reduced, an overlapped width of the gate electrode 107 and each of the source and drain electrodes 133 and 136 are also reduced. As a result, an area occupied by the TFT is reduced and an aperture ratio is increased.

In addition, since the overlapped area of the gate electrode 107 and each of the source and drain electrodes 133 and 136 is reduced, a parasitic capacitance between the gate electrode 107 and the source electrode 133 and between the gate electrode 107 and the drain electrode 136 is also reduced. Accordingly, properties of the TFT are improved.

Figure 4J:
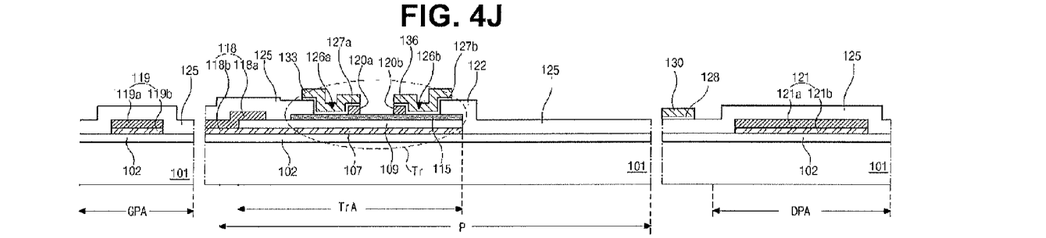

Next, as shown in FIG. 4J, a impurity-doped amorphous silicon layer (not shown) is formed on the interlayer insulating layer 125 by depositing impurity-doped amorphous silicon. The impurity-doped amorphous silicon layer has a thickness of about 100 to 300 angstroms.

On the other hand, before forming the impurity-doped amorphous silicon layer, a BOE cleaning process may be performed to remove an oxidation film, which is formed by exposing to an air through the first and second semiconductor contact holes 126a and 126b, on the active layer 115.

Before forming the impurity-doped amorphous silicon layer, a barrier layer may be formed by depositing intrinsic amorphous silicon. The barrier layer has a thickness of 50 to 300 angstroms. Contact strength between intrinsic amorphous silicon and intrinsic polycrystalline silicon is larger than that between impurity-doped amorphous silicon and intrinsic polycrystalline silicon. Accordingly, the barrier layer of intrinsic amorphous silicon is positioned between the active layer 115 and the impurity-doped amorphous silicon layer to improve contact strength between the active layer of intrinsic polycrystalline silicon and the impurity-doped amorphous silicon layer. The barrier layer is not essential.

After forming the impurity-doped amorphous silicon layer, a second metal layer (not shown) is formed on the impurity-doped amorphous silicon layer by depositing at least one of Al, Al alloy, Cu, Cu alloy, Cr, Mo and MoTi. The second metal layer having a single layer is shown.

Next, the second metal layer and the impurity-doped amorphous silicon layer are patterned by a mask process to form a data line 130 on the interlayer insulating layer 125, first and second ohmic contact layers 127a and 127b, a source electrode 133 and a drain electrode 136. The data line 130 crosses the gate line 118 to define the pixel region "P". The first and second ohmic contact layers 127a and 127b are formed from the impurity-doped amorphous silicon and positioned under the source and drain electrodes 133 and 136, respectively. The first and second ohmic contact layers 127a and 127b contact the active layer 125 through the first and second semiconductor contact holes 126a and 126b, respectively. The first and second ohmic contact layers 127a and 127b respectively have the plane shape and area as the source and drain electrodes 133 and 136 to completely overlap them. The source electrode 133 is connected to the data line 130 and spaced apart from the drain electrode 136. Since second metal layer and the impurity-doped amorphous silicon layer are patterned by one mask process, a dummy pattern of impurity-doped amorphous silicon is formed under the data line 130.

On the other hand, when the barrier layer is formed, the barrier layer is patterned with the second metal layer and the impurity-doped amorphous silicon layer such that barrier patterns (not shown) are respectively disposed under the first and second ohmic contact layers 127a and 127b The barrier patterns have substantially the same shape as the first and second ohmic contact layers 127a and 127b, respectively, and contacts the active layer 115 through the first to second semiconductor contact holes 126a and 126b of the interlayer insulating layer 125.

In the present invention, the impurity-doped amorphous silicon layer (not shown) is patterned by a dry-etching process to form the first and second ohmic contact layers 127a and 127b. However, since there is the etch-stopper 120 on the active layer 115, there is no damage on the active layer 115 during the dry-etching process. Accordingly, the problem in the related art of damage on the active layer during the dry-etching process for forming the ohmic contact layer is prevented.

Next, a center of the etch-stopper 120 (of FIG. 4I), which is exposed through a space between the source electrode 133 and the drain electrode 136, is etched by a wet-etching process to form first and second barrier metal patterns 120a and 120b and expose the active layer 115. Since the etch-stopper 120 is formed the metallic material, the etch-stopper 120 is wet-etched using an etchant. Because the etchant reacts with the metallic material of the etch-stopper 120, not the intrinsic polycrystalline silicon of the active layer 115, there is no damage on the active layer 115 even if the active layer 115 is exposed through the first and second barrier metal patterns 120a and 120b. Accordingly, damage on the active layer and a thickness difference of the active layer are prevented such that a property of the TFT is not degraded.

A PR pattern (not shown) is disposed on the source electrode 133, the drain electrode 136 and the data line 130 during the wet-etching process of the etch-stopper 120 such that there is no damage on the source electrode 133, the drain electrode 136 and the data line 130 by the etchant. In addition, although the first and second barrier metal patterns 120a and 120b respectively overlap the source and drain electrodes 133 and 136, there is no electrical connection between the source and drain electrodes 133 and 136 because the first and second barrier metal patterns 120a and 120b are spaced apart from each other.

Next, the PR pattern (not shown) is removed by a stripping process such that the source electrode 133, the drain electrode 136 and the data line 130 are exposed. The gate electrode 107, the gate insulating layer 109, the active layer 115 of intrinsic polycrystalline silicon, the interlayer insulating layer 125, the first and second barrier metal patterns 120a and 120b, the first and second ohmic contact layers 127a and 127b of impurity-doped amorphous silicon, the source electrode 133 and the drain electrode 136 constitute a TFT "Tr" in the transistor region "TrA". The TFT "Tr" may further include the barrier patterns.

Although not shown, when the array substrate used for an OELD, the array substrate further includes a power line and another TFT. The another TFT has substantially the same structure as the above TFT "Tr" and is connected to the power line and the above TFT "Tr". In the OELD, the above TFT "Tr" serves as a switching TFT, and the another TFT serves as a driving TFT.

Figure 4K:
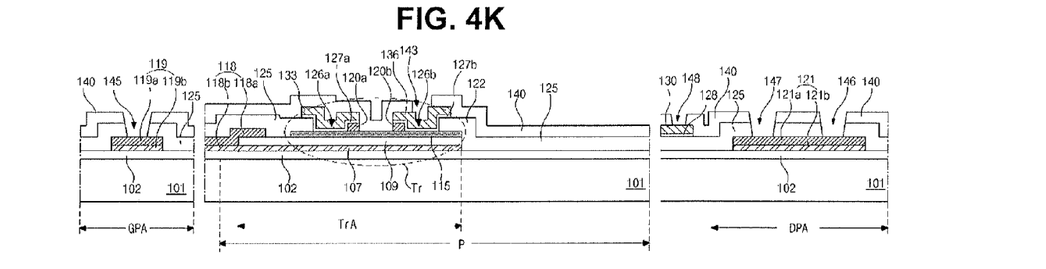

Next, as shown in FIG. 4K, a passivation layer 140 of an inorganic insulating material, such as silicon oxide and silicon nitride, or an organic insulating material, such as BCB and photo-acryl, is formed on the source and drain electrodes 133 and 136, and the data line 130. The passivation layer 140 is patterned by a mask process to form a drain contact hole 143 exposing the drain electrode 136 of the TFT "Tr". In addition, the interlayer insulating layer 125 in the gate pad region "GPA" and the data pad region "DPA" is patterned with the passivation layer 140 to form a gate pad contact hole 145, first and second data pad contact holes 146 and 147, and a data line contact hole 148. The gate pad contact hole 145 exposes the gate pad electrode 119, and the data line contact hole 148 exposes an end of the data line 130. The first and second data pad contact holes 146 and 147 respectively both ends of the data pad electrode 121.

Figure 4L:
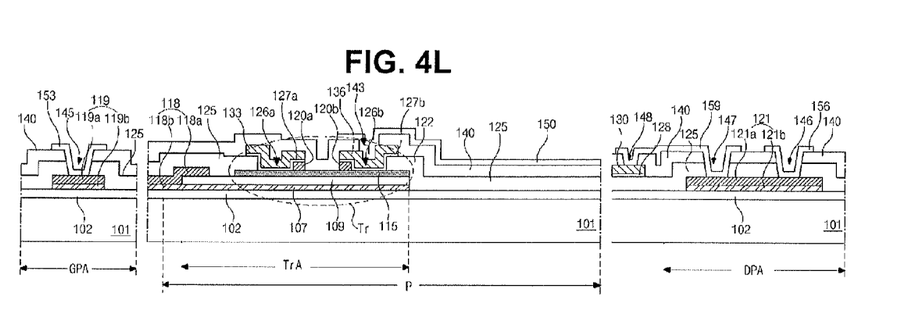

Next, as shown in FIG. 4L, a pixel electrode 150 is formed on the passivation layer 140 by depositing and patterning a conductive material layer (not shown). The conductive material layer is formed of a transparent conductive material, such as indium-tin-oxide (ITO) and indium-zinc-oxide (IZO), or a metallic material, such as Mo alloy. The pixel electrode 150 is positioned in the pixel region "P" and contacts the drain electrode 136 through the drain contact hole 143.

At the same time, an auxiliary gate pad electrode 153, an auxiliary data pad electrode 156 and a data connection pattern 159 are formed on the passivation layer 140. The auxiliary gate pad electrode 153 is disposed in the gate pad region "GPA" and contacts the gate pad electrode 119 through the gate pad contact hole 145. The auxiliary data pad electrode 156 is disposed in the data pad region "DPA" and contacts the data pad electrode 121 through the first data pad contact hole 146. One end of the data connection pattern 159 contacts the data pad electrode 121 through the second data pad contact hole 147, and the other end of the data connection pattern 159 contacts the data line 130 through the data line contact hole 148. As a result, the data pad electrode 121 is electrically connected to the data line 130 via the data connection pattern 159. The data connection pattern 159 and the auxiliary data pad electrode 156 may be formed as one body.

As shown in FIG. 4L, the data pad electrode 121 and the data line 130 are positioned at different layers and electrically connected to each other via the data connection pattern 159. Alternatively, the data pad electrode 121 may be formed with the data line 130 and directly connected to the data line 130 without the data connection pattern 159.

Although not shown, the array substrate is used for the OELD, the pixel electrode 150 contacts a drain electrode of the driving TFT instead of the drain electrode 136 of the above TFT "Tr". In addition, a bank is formed on the pixel electrode 150 and at boundaries of the pixel region "P". Namely, the bank covers edges of the pixel electrode 150 and has an opening corresponding to a center of the pixel electrode 150. An organic emitting layer may be formed on the pixel electrode 150 and in the pixel region P. Namely, the organic emitting layer is positioned in the opening of the bank. The pixel electrode 150 as a first electrode serves as one of a cathode and anode for an organic electroluminescent diode. A second electrode covering an entire of the substrate 101 is formed on the organic emitting layer. The second electrode serves as the other one of the cathode and the anode. The pixel electrode 150 as the first electrode, the organic emitting layer and the second electrode constitute an organic electroluminescent diode of the array substrate for an OELD device.

The array substrate in the present invention including the active layer of polycrystalline silicon is fabricated by a six mask process with a conventional process line without an implant apparatus. In addition, damage on the active layer by a dry-etching process is prevented by the etch-stopper such that a property of the TFT is not degraded. Furthermore, a size of the semiconductor contact holes is reduced due to the etch-stopper such that an aperture ratio is increased and a parasitic capacitance is reduced.

Figure 7A:
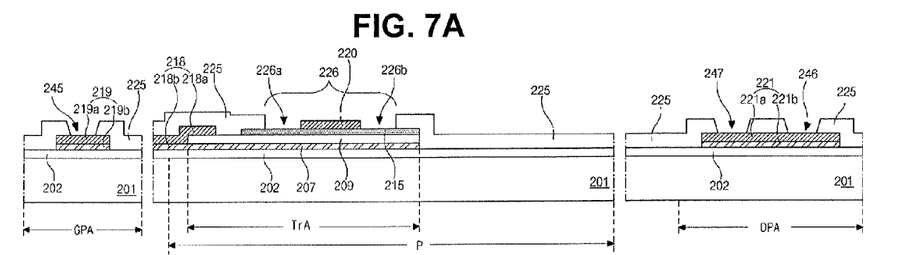
FIGS. 7A to 7C are cross-sectional views showing a fabricating process of an array substrate for an LCD device according to an embodiment of the present invention.
Figure 7B:
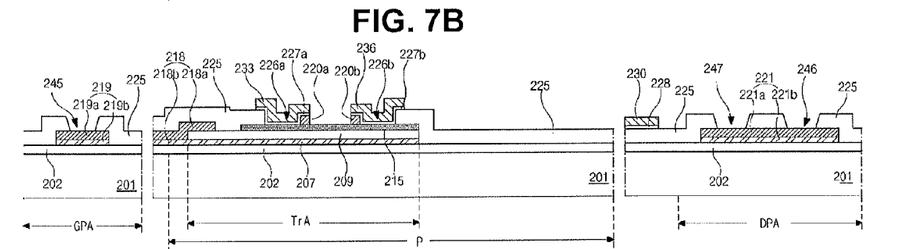
Figure 7C:
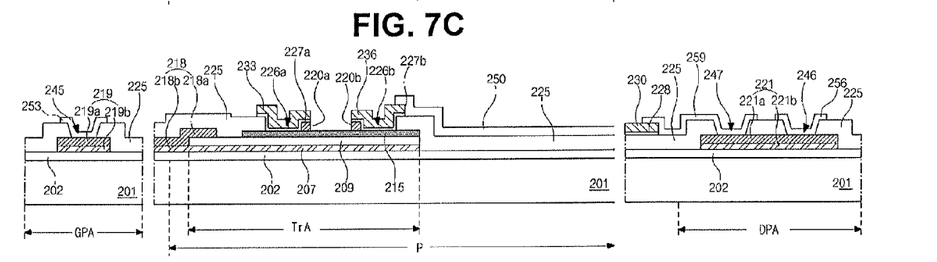

FIGS. 7A to 7C are cross-sectional views showing a fabricating process of an array substrate for an LCD device according to an embodiment of the present invention. Explanation of the fabricating process is focused on process after forming the data line, the source electrode, the drain electrode, the ohmic contact layers, and the barrier metal patterns.

The processes in FIGS. 4A to 4H are performed to form the buffer layer 202, the active layer 215, the gate line 218, the gate electrode 207, the gate insulating layer 209, the etch-stopper 220, the gate pad electrode 219 and the data pad electrode 221 on the substrate 201.

Then, as shown in FIG. 7A, a second insulating layer (not shown) is formed on the active layer 215, the etch-stopper 220, the gate line 218, the gate pad electrode 219 and the data pad electrode 221 by depositing an inorganic insulating material, such as silicon oxide and silicon nitride, or coating an organic insulating material, such as BCB and photo-acryl.

The second insulating layer is patterned by a mask process to form an interlayer insulating layer 225 including an opening 226, a gate pad contact hole 245 and first and second data pad contact holes 246 and 247. The opening 226 corresponds to a center of the active layer 215. The opening 226 overlaps the etch-stopper 220 and has a size larger than the etch-stopper 220 such that the opening 226 is divided into first and second semiconductor contact holes 226a and 226b with respect to the etch-stopper 220. One and the other sides of the active layer 215 are respectively exposed through the first and second semiconductor contact holes 226a and 226b. The gate pad contact hole 245 is disposed in the gate pad region "GPA" and exposes the gate pad electrode 219. The first and second data pad contact holes 246 and 247 are disposed in the data pad region "DPA" and respectively expose both ends of the data pad electrode 221.

Next, as shown in FIG. 7B, a impurity-doped amorphous silicon layer (not shown) and a second metal layer (not shown) are sequentially formed on the interlayer insulating layer 225. The impurity-doped amorphous silicon layer is formed of impurity-doped amorphous silicon, and the second metal layer is formed of at least one of Al, Al alloy, Cu, Cu alloy, Cr, Mo and MoTi. The impurity-doped amorphous silicon layer has a thickness of about 100 to 300 angstroms.

The second metal layer and the impurity-doped amorphous silicon layer are patterned by a mask process to form a data line 230 on the interlayer insulating layer 225, first and second ohmic contact layers 227a and 227b, a source electrode 233 and a drain electrode 236. The data line 230 crosses the gate line 218 to define the pixel region "P". The first and second ohmic contact layers 227a and 227b are formed from the impurity-doped amorphous silicon and positioned under the source and drain electrodes 233 and 236, respectively. The first and second ohmic contact layers 227a and 227b contact the active layer 125 through the first and second semiconductor contact holes 226a and 226b, respectively. Although not shown, barrier patterns may be positioned between each of the first and second ohmic contact layers 227a and 227b and the active layer 215.

Next, a center of the etch-stopper 220 (of FIG. 7A), which is exposed through a space between the source electrode 233 and the drain electrode 236, is etched by a wet-etching process to form first and second barrier metal patterns 220a and 220b and expose the active layer 215.

Next, as show in FIG. 7C, a conductive material layer (not shown) is formed by depositing a transparent conductive material, such as ITO and IZO, or a metallic material. The metallic material of the conductive material layer has an etching-selectivity with the metallic material of the source and drain electrodes 233 and 236 such that there is no damage on the source and drain electrodes 233 and 236 by an etching process for the conductive material layer. For example, when the source and drain electrodes 233 and 236 are formed of Al or Al alloy, the conductive material layer may be formed of Mo or MoTi. Al or Al alloy is wet-etched by a first etchant, while Mo or MoTi is wet-etched by a second etchant, which does not react with Al and Al alloy, or is dry-etched.

The conductive material layer is patterned to form a pixel electrode 250. The pixel electrode 250 is positioned in the pixel region "P" and contacts the drain electrode 236. Since there is no passivation layer 140 (of FIG. 4L), the pixel electrode 250 directly contacts the drain electrode 236.

At the same time, an auxiliary gate pad electrode 253, an auxiliary data pad electrode 256 and a data connection pattern 259 are formed on the interlayer insulating layer 225. The auxiliary gate pad electrode 253 is disposed in the gate pad region "GPA" and contacts the gate pad electrode 219 through the gate pad contact hole 245. The auxiliary data pad electrode 256 is disposed in the data pad region "DPA" and contacts the data pad electrode 221 through the first data pad contact hole 246. One end of the data connection pattern 259 contacts the data pad electrode 221 through the second data pad contact hole 247, and the other end of the data connection pattern 259 contacts the data line 230. As a result, the data pad electrode 221 is electrically connected to the data line 230 via the data connection pattern 259. The data connection pattern 259 and the auxiliary data pad electrode 256 may be formed as one body. Since there is no passivation layer 140 (of FIG. 4L), the data connection pattern 259 directly contacts the data line 230.

Although not shown, when the array substrate is used for the OELD, elements, such as the power line, the driving TFT, the bank, and so on, may be further formed.

Since the array substrate shown in FIGS. 7A to 7C is fabricated without the passivation layer, one mask process is reduced with compared to the array substrate shown in FIGS. 4A to 4L.

The array substrate in the present invention including the active layer of polycrystalline silicon is fabricated by a six mask process with a conventional process line without an implant apparatus. In addition, damage on the active layer by a dry-etching process is prevented by the etch-stopper such that a property of the TFT is not degraded. Furthermore, a size of the semiconductor contact holes is reduced due to the etch-stopper such that an aperture ratio is increased and a parasitic capacitance is reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of fabricating an array substrate, comprising:
   forming a first metal layer on a substrate including a transistor region in a pixel region;
   forming a gate insulating layer on the first metal layer and an active layer of polycrystalline silicon on the gate insulating layer, the gate insulating layer and the active layer disposed in the transistor region,
   forming a second metal layer on an entire surface of the substrate including the active layer;
   forming a gate line, an etch-stopper and a gate electrode by patterning the second metal layer and the first metal layer, the gate electrode disposed in the transistor region and under the gate insulating layer, the etch-stopper disposed on the active layer, and the gate line contacting an end of the gate electrode;
   forming an interlayer insulating layer disposed on the gate line and including an opening, wherein the opening corresponds to the etch-stopper such that the opening is divided into first and second semiconductor contact holes respectively exposing both sides of the active layer;

forming first and second ohmic contact layers of impurity-doped amorphous silicon, a source electrode, a drain electrode and a data line on the interlayer insulating layer, the first and second ohmic contact layers respectively contacting both sides of the active layer through the first and second semiconductor contact holes, the source electrode and the drain electrode respectively disposed on the first and second ohmic contact layers, and the data line crossing the gate line to define the pixel region and being connected to the source electrode;

removing a portion of the etch-stopper exposed through a space between the source electrode and the drain electrode; and forming a pixel electrode in the pixel region and contacting the drain electrode.

2. The method according to claim 1, wherein the forming the gate line, the etch-stopper and the gate electrode includes forming a gate pad electrode at an end of the gate line and a data pad electrode, wherein the data pad electrode is electrically connected to the data line.

3. The method according to claim 2, wherein each of the gate pad electrode and the data pad electrode has a double-layered structure, and wherein first and second layers of the double-layered structure is formed from the first and second metal layers, respectively.

4. The method according to claim 2, wherein the interlayer insulating layer further includes a gate pad contact hole exposing the gate pad electrode and first and second data pad contact holes respectively exposing both ends of the data pad electrode.

5. The method according to claim 4, wherein forming the pixel electrode includes forming an auxiliary gate pad electrode, an auxiliary data pad electrode and a data connection pattern, wherein the auxiliary gate pad electrode contacts the gate pad electrode through the gate pad contact hole, and the auxiliary data pad electrode contacts the data pad electrode through the first data pad contact hole, and wherein one end of the data connection pattern contacts the data pad electrode through the second data pad contact hole, and the other end of the data connection pattern contacts the data line.

6. The method according to claim 1, comprising:
forming a passivation layer on an entire surface of the substrate including the source and drain electrodes; and
patterning the passivation layer to form a drain contact hole,
wherein the pixel electrode is disposed on the passivation layer and contacts the drain electrode through the drain contact hole.

7. The method according to claim 6, wherein forming the gate line, the etch-stopper and the gate electrode includes forming a gate pad electrode at an end of the gate line and a data pad electrode, wherein the data pad electrode is electrically connected to the data line.

8. The method according to claim 7, wherein patterning the passivation layer further includes pattering the passivation layer with the interlayer insulating layer to form a gate pad contact hole exposing the gate pad electrode, first and second data pad contact holes respectively exposing both ends of the data pad electrode, and a data line contact hole exposing an end of the data line.

9. The method according to claim 8, wherein forming the pixel electrode includes forming an auxiliary gate pad electrode, an auxiliary data pad electrode and a data connection pattern, wherein the auxiliary gate pad electrode contacts the gate pad electrode through the gate pad contact hole, and the auxiliary data pad electrode contacts the data pad electrode through the first data pad contact hole, and wherein one end of the data connection pattern contacts the data pad electrode through the second data pad contact hole, and the other end of the data connection pattern contacts the data line through the data line contact hole.

10. The method according to claim 1, wherein the first metal layer includes a metallic material having a melting point above about 800° C.

11. The method according to claim 10, wherein the metallic material includes one of molybdenum, molybdenum-titanium alloy, copper, and copper alloy.

12. The method according to claim 1, wherein forming the gate insulating layer and the active layer includes:
sequentially forming an insulating layer and an intrinsic amorphous silicon layer on the first metal layer;
crystallizing the intrinsic amorphous silicon layer into an intrinsic polycrystalline silicon layer;
forming a first photoresist pattern and a second photoresist pattern in the transistor region and on the intrinsic polycrystalline silicon layer, the first photoresist pattern having a thickness larger than the second photoresist pattern;
removing the intrinsic polycrystalline silicon layer and the insulating layer using the first and second photoresist patterns as an etching mask to form the gate insulating layer and an intrinsic polycrystalline silicon pattern;
removing the second photoresist pattern by an ashing process to expose an end of the intrinsic polycrystalline silicon pattern;
removing the exposed end of the intrinsic polycrystalline silicon pattern to form the active layer and expose an end of the gate insulating layer; and
removing the first photoresist pattern.

13. The method according to claim 12, wherein an end of the gate line is disposed on the exposed end of the gate insulating layer.

14. The method according to claim 1, wherein each of the first and second semiconductor contact holes has a width smaller than about 5 micrometers.

15. The method according to claim 1, comprising forming first and second barrier patterns disposed on the active layer and under the first and second ohmic contact layers, respectively, and formed of intrinsic amorphous silicon.

16. The method according to claim 1, comprising forming a cleaning process onto the exposed sides of the active layer using a buffered oxide etchant before the step of forming the first and second ohmic contact layers, the source electrode, the drain electrode and the data line.

17. The method according to claim 1, comprising forming a buffer layer of an inorganic insulating material or an organic insulating material on the substrate before the step of forming the first metal layer.

18. The method according to claim 1, wherein forming the first and second ohmic contact layers, the source electrode, the drain electrode and the data line includes:
sequentially forming an impurity-doped amorphous silicon layer and a second metal layer;
patterning the second metal layer to form the source electrode, the drain electrode and the data line and expose a portion of the impurity-doped amorphous silicon layer through a space between the source electrode and a drain electrode; and
removing the exposed portion of the impurity-doped amorphous silicon layer by a dry-etching process to form the first and second ohmic contact layers, wherein a center portion of the active layer is covered with the etch-stopper such that the active layer has an uniform thickness.

* * * * *